(12) United States Patent
Chen et al.

(10) Patent No.: US 8,525,310 B2
(45) Date of Patent: Sep. 3, 2013

(54) LEADFRAME PACKAGE FOR HIGH-SPEED DATA RATE APPLICATIONS

(75) Inventors: Nan-Jang Chen, Hsinchu (TW);
Chun-Wei Chang, New Taipei (TW);
Sheng-Ming Chang, New Taipei (TW);
Che-Yuan Jao, Hsinchu (TW);
Ching-Chih Li, New Taipei (TW);
Nan-Cheng Chen, Hsin-Chu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 276 days.

(21) Appl. No.: 13/085,446

(22) Filed: Apr. 12, 2011

(65) Prior Publication Data

US 2011/0248394 A1    Oct. 13, 2011

Related U.S. Application Data

(60) Provisional application No. 61/323,427, filed on Apr. 13, 2010.

(51) Int. Cl.
*H01L 23/495*    (2006.01)

(52) U.S. Cl.
USPC ........... 257/676; 257/723; 257/678; 257/690; 257/713; 257/E23.039

(58) Field of Classification Search
USPC .......... 257/676, 723, 678, 690, 713, E23.039, 257/696, 784, 666, 787
See application file for complete search history.

(56) References Cited

U.S. PATENT DOCUMENTS

| | | | |
|---|---|---|---|
| 6,437,427 B1 | 8/2002 | Choi | |
| 6,630,373 B2 | 10/2003 | Punzalan | |
| 6,876,069 B2 | 4/2005 | Punzalan | |
| 7,230,323 B2 | 6/2007 | Lee | |
| 7,242,077 B2 | 7/2007 | Ma | |
| 7,409,572 B1 | 8/2008 | Hung | |
| 7,657,774 B1 | 2/2010 | Hung | |
| 2003/0160309 A1 | 8/2003 | Punzalan | |
| 2007/0278633 A1* | 12/2007 | Uematsu | 257/676 |
| 2008/0211089 A1* | 9/2008 | Khan et al. | 257/723 |

OTHER PUBLICATIONS

B. Young, Digital Signal Integrity. Upper Saddle River, NJ: Prentice-Hall, 2001, Chapter 5.
H. Johnson, and M. Graham, High-Speed Digital Design. Upper Saddle River, NJ: Prentice-Hall, 1993, ch. 5.

* cited by examiner

*Primary Examiner* — S. V. Clark
*Assistant Examiner* — Krista Soderholm
(74) *Attorney, Agent, or Firm* — Winston Hsu; Scott Margo

(57) ABSTRACT

A semiconductor package includes a die pad; a semiconductor die mounted on the die pad; a plurality of leads disposed along peripheral edges of the die pad; a ground bar between the leads and the die pad; and a plurality of bridges connecting the ground bar with the die pad, wherein a gap between two adjacent bridges has a length that is equal to or less than 3 mm.

11 Claims, 16 Drawing Sheets

1 clock pair drives 2 DRAMs

LEADFRAME PACKAGE FOR HIGH-SPEED DATA RATE APPLICATIONS

CROSS REFERENCE TO RELATED APPLICATIONS

This application claims the benefit of U.S. provisional application No. 61/323,427 filed Apr. 13, 2010.

BACKGROUND OF THE INVENTION

1. Field of the Invention

The present invention relates generally to the field of semiconductor package device. More particularly, the present invention relates to a leadframe package suited for high-speed data rate applications.

2. Description of the Prior Art

As known in the art, semiconductor memories such as DRAMs or SDRAMs are arranged close to the core logic unit or execution unit and can be accessed much faster than the disk drive. Conventionally, DRAMs or SDRAMs are linked to the execution unit by a memory controller and stand-alone memory bus. To meet the bandwidth requirements in recent consumer electronics market, DDR3 SDRAM or double-data-rate three synchronous dynamic random access memory has been widely developed for high-speed digital interface applications, for example, high-performance graphics, where high bandwidth data transfer between frame buffers is required.

DDR3 SDRAM is a random access memory technology used for high speed storage of the working data of a computer or other digital electronic device. The primary benefit of DDR3 is the ability to transfer I/O data at eight times the speed of the memory cells it contains, thus enabling faster bus speeds and higher peak throughput than earlier memory technologies. However, there is no corresponding reduction in latency, which is therefore proportionally higher. Typically, DDR3 modules can transfer data at a rate of 800-2133 MT/s using both rising and falling edges of a 400-1066 MHz I/O clock. The MT/s is normally twice that of MHz by double sampling, one on the rising clock edge, and the other, on the falling.

To achieve high-speed data rate, the channel performance, including the package and the PCB, between the DRAM controller and the DRAM chip plays a significant role. Typically, to improve the channel performance and to preserve a better signal and power integrity, a DDR3 SDRAM memory controller is assembled using ball grid array (BGA) package and 4-layer PCB. However, the BGA package and the 4-layer PCB are costly. It would be desirable to use a less expensive packaging technique such as low-profile quad flat (LQFP) package without compromising the data transfer rate.

SUMMARY OF THE INVENTION

It is one objective of this invention to provide an improved semiconductor package structure that is capable of improving channel performance in the memory system.

It is another objective of this invention to provide a DDR3 SDRAM memory controller assembled using an improved leadframe package with reduced insertion loss in high frequency region.

It is still another objective of this invention to provide a memory controller leadframe package that can be used in combination with one-layer or 2-layer PCB in order to reduce system cost.

To these ends, according to one aspect of the present invention, there is provided a semiconductor package including a die pad; a semiconductor die mounted on the die pad; a plurality of leads disposed along peripheral edges of the die pad; a ground bar to a second horizontal plane between the leads and the die pad; a plurality of bridges connecting the ground bar with the die pad, wherein a gap between two adjacent bridges has a length that is equal to or less than 3 mm; a plurality of first bond wires extending between the semiconductor die and the leads; a plurality of second bond wires extending between the semiconductor die and the ground bar; and a molding compound at least partially encapsulating the die pad, inner ends of the leads such that bottom surface of the die pad is exposed within the molding compound.

From one aspect of this invention, a semiconductor package includes a die pad; a semiconductor die mounted on the die pad; a plurality of leads disposed along peripheral edges of the die pad; at least one ground bar between the leads and the die pad; a sidewall connecting the ground bar with the die pad; a plurality of first bond wires extending between the semiconductor die and the leads; a plurality of second bond wires extending between the semiconductor die and the ground bar; and a molding compound at least partially encapsulating the die pad, inner ends of the leads such that bottom surface of the die pad is exposed within the molding compound.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

Figure 1A:
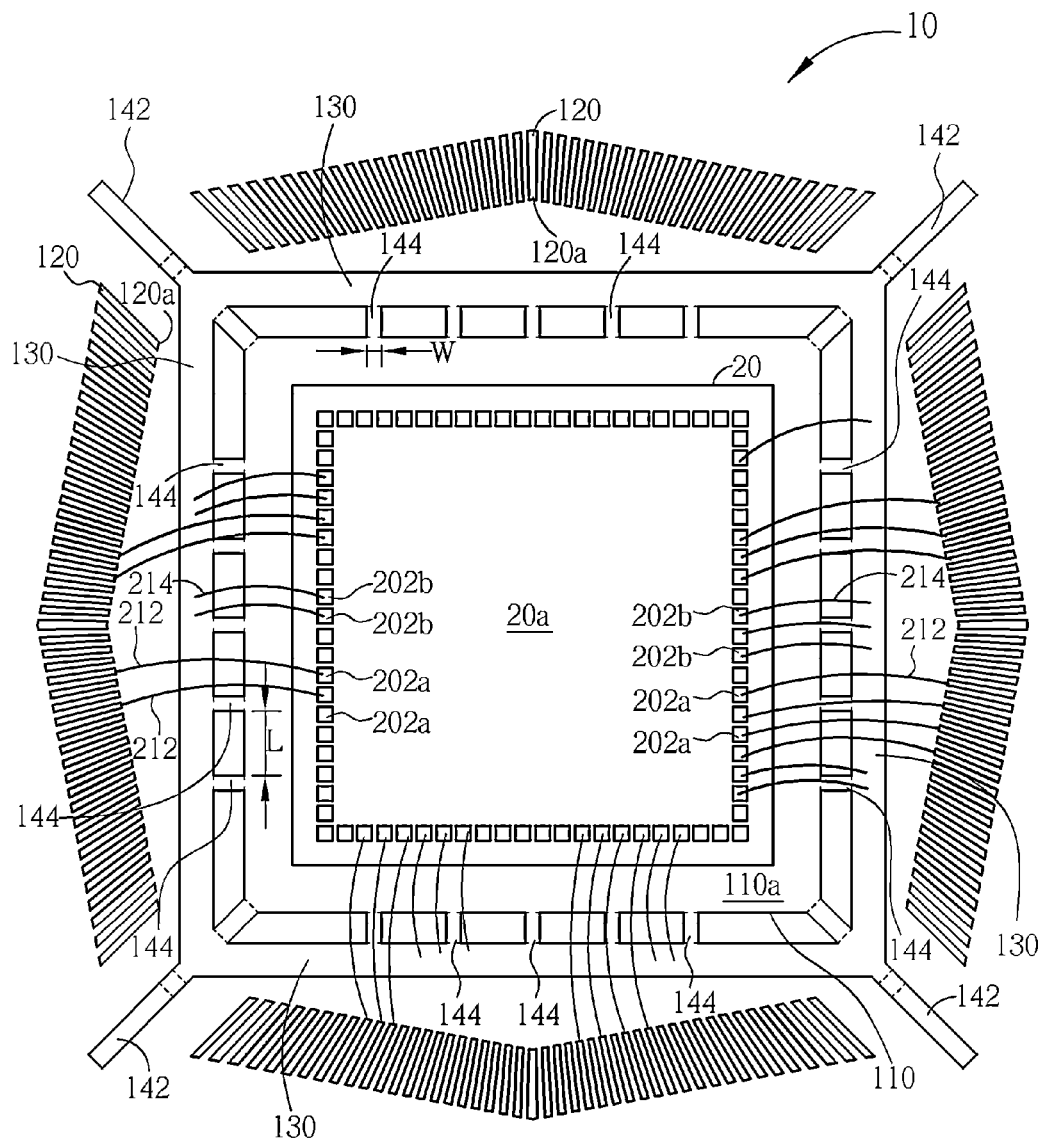
FIG. 1A is a top view of an exemplary semiconductor package according to one embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

The present invention pertains to an improved leadframe package such as a quad flat package (QFP) or a low-profile quad flat package (LQFP), which is particularly suited for the memory interface that is operated at high-speed data rates, for example, a data rate or an external memory data rate that is greater than or equal to 1 Gb/s. According to one aspect of the invention, a high-speed device such as a DDR2, DDR3 or DDR4 memory controller chip or an SoC with DDR3 memory controller is assembled with the LQFP technique without compromising the channel performance between the memory controller and the memory chip. However, there is an obstacle to employing the leadframe package in high-speed data rate applications such as high-speed data rate memory interface like DDR3 SDRAM memory systems. This is partly because of the significant insertion loss of the leadframe package in high frequency domain, for example, 1.0 Gb/s~2.0 Gb/s. The present invention addresses this issue.

Conventionally, a leadframe includes a plurality of metal leads temporarily held together in a planar arrangement about a central region during package manufacture by a rectangular frame. A die pad is supported in the central region by a plurality of connecting bars that attach to the frame. The leads extend from a first end integral with the frame to an opposite second end adjacent to, but spaced apart from, the die pad. During package manufacture, a semiconductor die is attached to the die pad. Wire-bonding pads on the die are then connected to selected ones of the inner ends of the leads by fine, conductive bonding wires to convey power, ground or signals between the die and the leads. A protective body of an epoxy resin is molded over the assembly to enclose and seal the die, the inner ends of the leads, and the wire bonds against harmful environmental elements. The rectangular frame and the outer ends of the leads are left exposed outside of the body, and after molding, the frame is cut away from the leads and discarded, and the outer ends of the leads are appropriately formed for interconnection of the package with an external printed circuit board.

One type of the leadframe semiconductor packages is the so-called exposed die pad (E-pad) leadframe package that exposes the bottom surface of the die pad to the outside of the encapsulation body. The exposed die pad can act as a heat sink and can improve the heat-dissipation efficiency. Typically, the exposed die pad is electrically connected to a ground plane of the external printed circuit board. It has been found that the E-pad leadframe package is subject to attacks of moisture. To avoid reliability problems due to moisture attacks and delamination along the plastic body-metal interface, the ground wires extended from the ground pads of the semiconductor die are not directly bonded onto the surface of the die pad, but instead the ground wires are bonded to a rectangular ring shaped ground bar that encircles the die pad at different downset planes. Typically, the ground bar is supported by tie bars that connected with the die pad.

In the following description, numerous specific details are given to provide a thorough understanding of the invention. However, it will be apparent to one skilled in the art that the invention may be practiced without these specific details. In order to avoid obscuring the present invention, some well-known system configurations and/or process steps are not disclosed in detail. The drawings showing embodiments of the apparatus are semi-diagrammatic and not to scale and, particularly, some of the dimensions are for the clarity of presentation and are shown exaggerated in the figures.

Figure 1B:
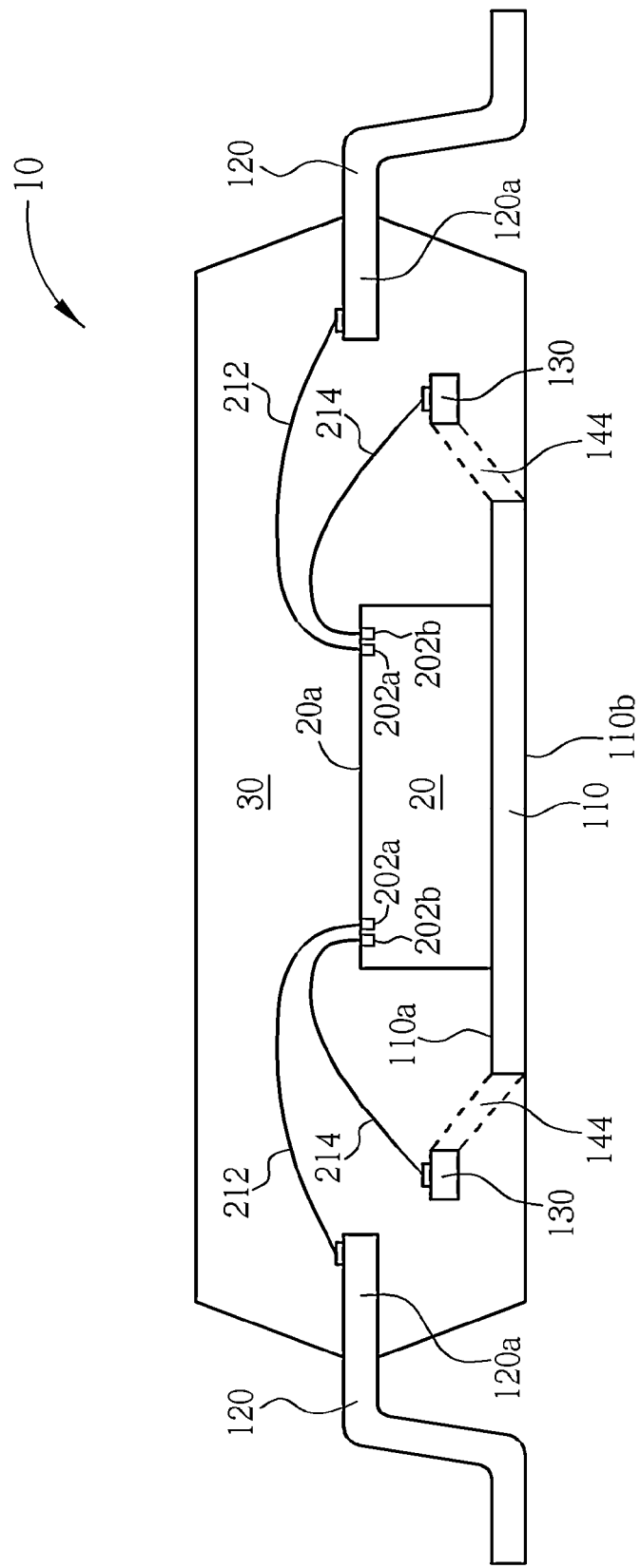
FIG. 1B is a schematic, cross-sectional view of the semiconductor package of FIG. 1.
Figure 2:
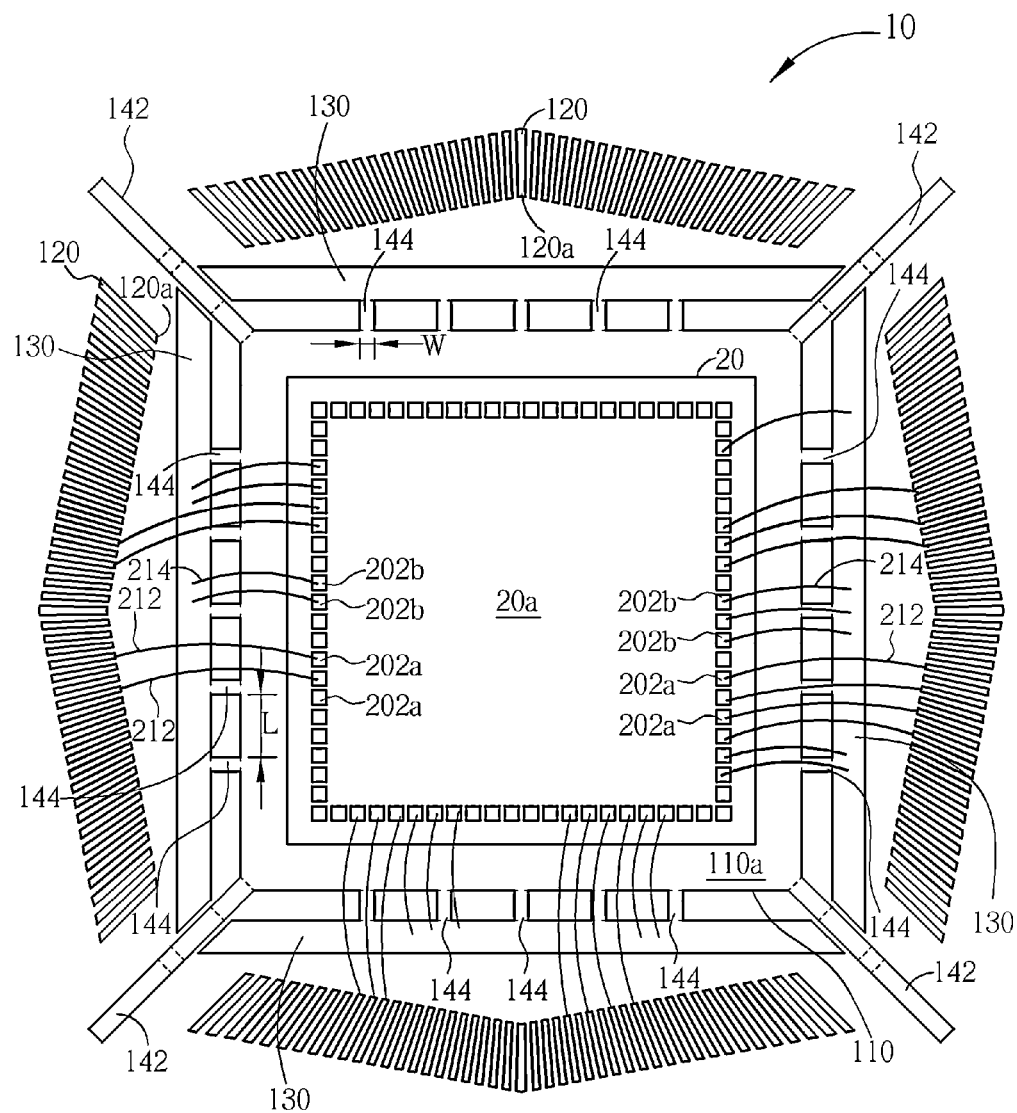
FIG. 2 is a top view of an exemplary semiconductor package according to another embodiment of the present invention.

FIG. 1A is a top view of an exemplary semiconductor package according to one embodiment of the present invention. FIG. 1B is a schematic, cross-sectional view of the semiconductor package of FIG. 1A. As shown in FIG. 1A and FIG. 1B, a semiconductor package 10 comprises a semiconductor die 20 mounted onto the first surface 110a of a die pad 110 having, for example, four peripheral edges, a plurality of leads 120 in a first horizontal plane disposed along the four peripheral edges of the die pad 110, four ground bars 130 downset from the first horizontal plane to a second horizontal plane (shown in FIG. 1B), four connecting bars 142 extending outward from four corners of the die pad 110, and a plurality of downset bridges 144 connecting the ground bars 130 with the die pad 110. The four ground bars 130 are disposed between inner ends 120a of the leads 120 and the die pad 110. It is to be understood that the leads 120 and the ground bars 130 may not be in different horizontal planes in other cases. Each of the four ground bars 130 is disposed along each of four peripheral edges of the die pad 110, and is connected to two adjacent connecting bars 142. For other embodiments, the ground bars 130 may not be connected to the connecting bars 142, such as an example shown in FIG. 2. A molding compound 30 at least partially encapsulating the die pad 110 and the inner ends 120a of the leads 120, such that the bottom surface 110b of the die pad 110 is exposed.

The semiconductor die 20 comprises a plurality of bonding pads 202 arranged on an area 20a thereof. The semiconductor die 20 may include, but not limited to, a memory controller chip such as a DDR2, DDR3 or DDR4 SDRAM controller. The bonding pads 202 further comprise a plurality of signal pads 202a and a plurality of ground pads 202b. A plurality of first bonding wires 212 are provided to electrically connect the respective signal pads 202a to the leads 120. A plurality of second bonding wires 214 are provided to electrically connect the respective ground pads 202b to the ground bars 130.

According to the embodiment of this invention, the number of the bridges 144 on each peripheral edge of the die pad 110 is critical to the semiconductor package 10 for the reduction of the insertion loss. The larger the insertion loss in the frequency domain, the larger the waveform degrades in the time domain. That is, the number of the bridges 144 connected to each of the four ground bars 130 is critical for the purpose of reducing the insertion loss of the packaged memory controller. According to the embodiment of this invention, preferably, the number of the bridges 144 on each peripheral edge of the die pad 110 is equal to or greater than four (number of the bridges per ground bar N≧4). In the illustrated embodiment, as shown in FIG. 1A, there are five bridges 144 along each peripheral edge of the die pad 110. However, it is to be understood that other numbers of the bridges can be applicable in other cases as long as the number of the bridges 144 is equal to or greater than four. The gap length L between two adjacent bridges 144 is also an important parameter. According to the embodiment of this invention, preferably, the gap length L between two adjacent bridges 144 is equal to or less than 3 mm (L≦3 mm). According to the embodiment of this invention, preferably, the width of each of the bridges 144 is equal to or greater than 0.1 mm (W≧0.1 mm).

Figure 3:
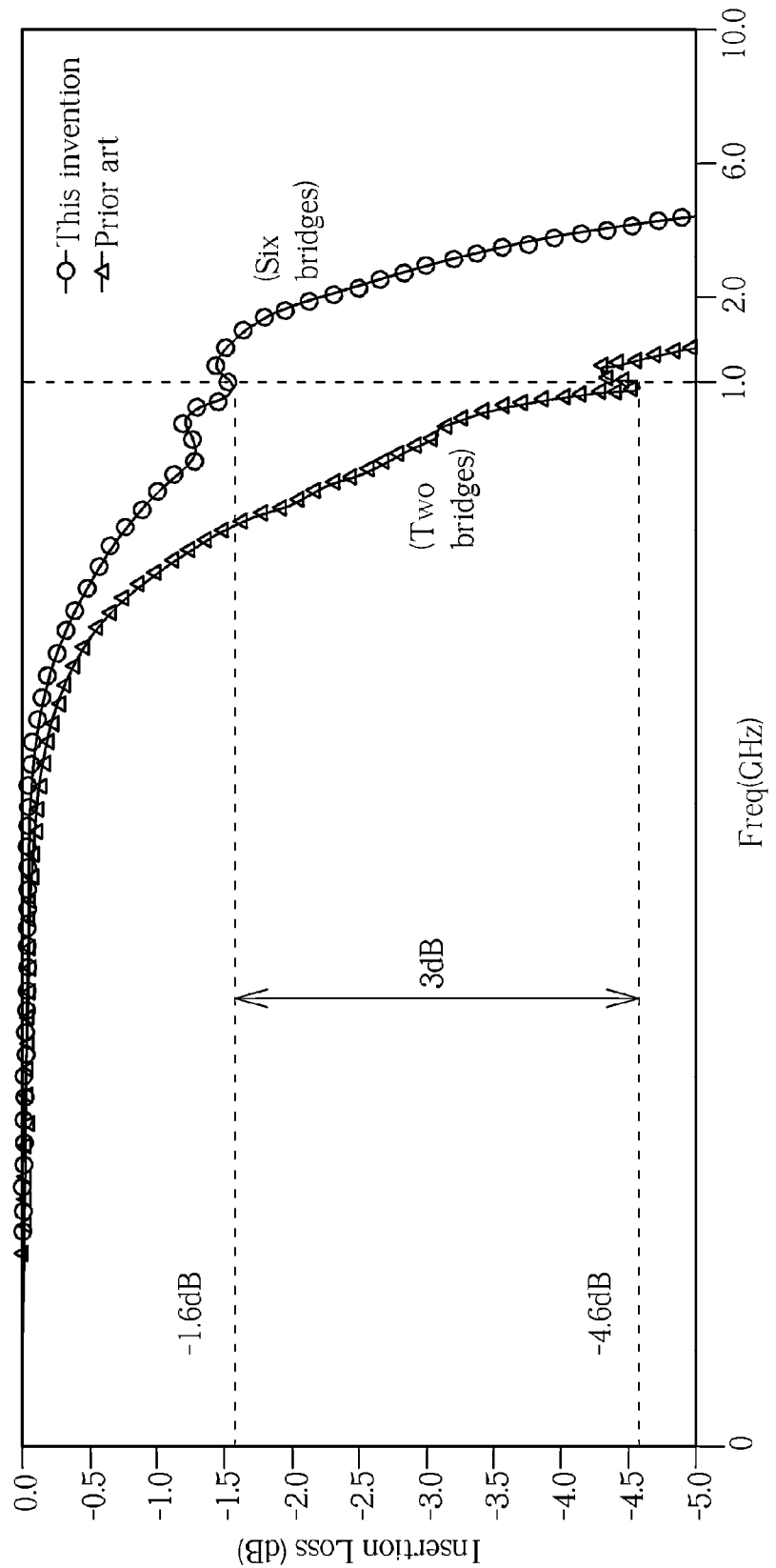
FIG. 3 illustrates a simulation diagram showing the improvement in the insertion loss (S-parameters) of the semiconductor LQFP package with six bridges on each peripheral edge of the die pad according to one embodiment of the present invention.

FIG. 3 illustrates a simulation diagram showing the improvement in the insertion loss (S-parameters) of the semiconductor LQFP package with six bridges on each peripheral edge of the die pad. The simulation result is based on a DDR3 SDRAM controller chip assembled using E-pad LQFP package. As shown in FIG. 3, the prior art package with two bridges on each peripheral edge of the die pad has a larger insertion loss of about −4.6 dB at 1.0 GHz. In comparison, the invention semiconductor package with six bridges on each peripheral edge of the die pad has a much smaller insertion loss of about −1.6 dB at 1.0 GHz. A significant improvement of insertion loss with 3 dB at 1.0 GHz can be achieved.

Figure 4:
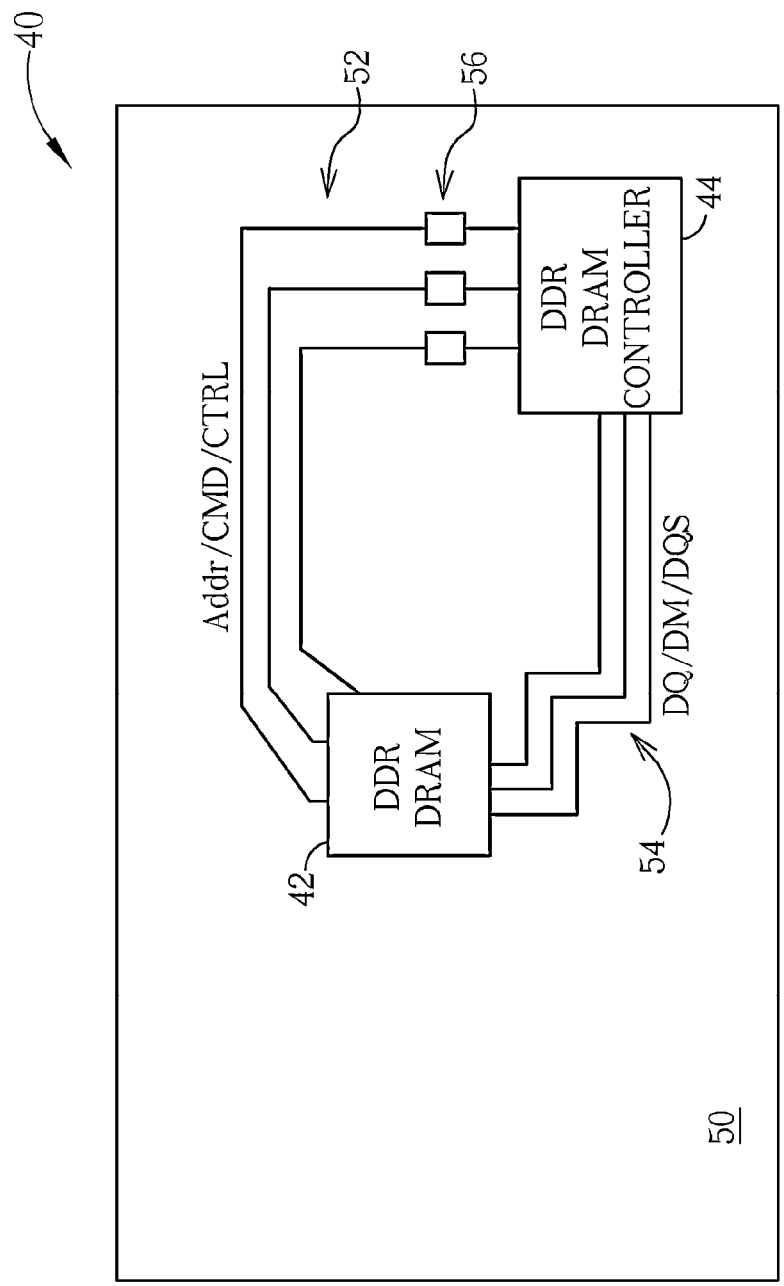
FIG. 4 is a block diagram of an exemplary memory system comprising a DDR DRAM package arranged on a surface of a PCB, along with a DDR DRAM controller, in accordance with another embodiment of this invention.

FIG. 4 is a schematic block diagram showing an exemplary high-speed memory system 40 established on a 2-layer PCB 50 according to another embodiment of this invention. As shown in FIG. 4, the memory system 40 comprises a DDR DRAM package 42 such as a DDR2/DDR3/DDR4 SDRAM package, and a DDR DRAM controller package 44 such as a DDR2/DDR3/DDR4 SDRAM controller package using the E-pad LQFP as set forth in FIGS. 1A and 1B, both of which are mounted to the same side of the 2-layer PCB 50. Memory busses 52 and 54 may run from the DDR DRAM controller package 44 to the DDR DRAM package 42. For example, as shown in FIG. 4, the memory busses 52 may transmit Addr (address)/CMD (command)/CTRL (control) signals, while the memory busses 54 may transmit DQ (data bus)/DM (data mask)/DQS (data strobe) signals. In addition, damping resistors 56 for CLK/Addr/CTRL may be disposed in the memory busses 52 with a damping resistance (Rd) greater than or equal to 5Ω. In other embodiments, the DDR DRAM controller package 44 may drive more than one DRAM memory chip within the memory system. According to the embodiment of this invention, the bottom of the die pad (not explicitly shown) in the DDR DRAM controller package 44 is electrically coupled to a ground plane of the 2-layer PCB 50. According to the embodiment of this invention, all data (DQ/DM/DQS) and Addr/CMD/CTRL traces are routed on the same layer as the memory controller on the 2-layer PCB 50. Although the 2-layer PCB is used as an example in the illustrated case, it is to be understood that other PCB with different layers of traces can be used, for example, one-layer PCB or 4-layer PCB.

Figure 5A:
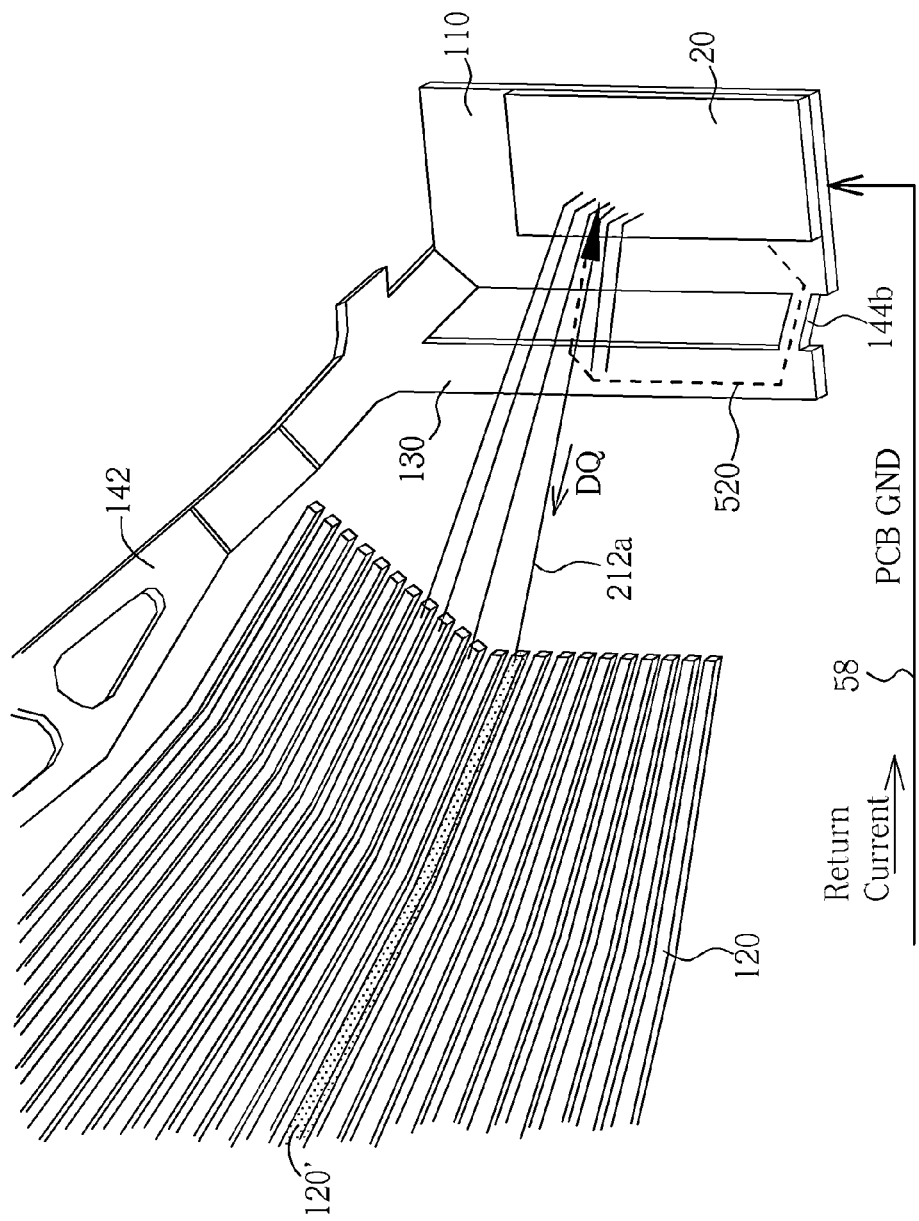
FIG. 5A is a schematic, perspective view of a portion of a conventional E-pad LQFP with only two bridges per side.
Figure 5B:
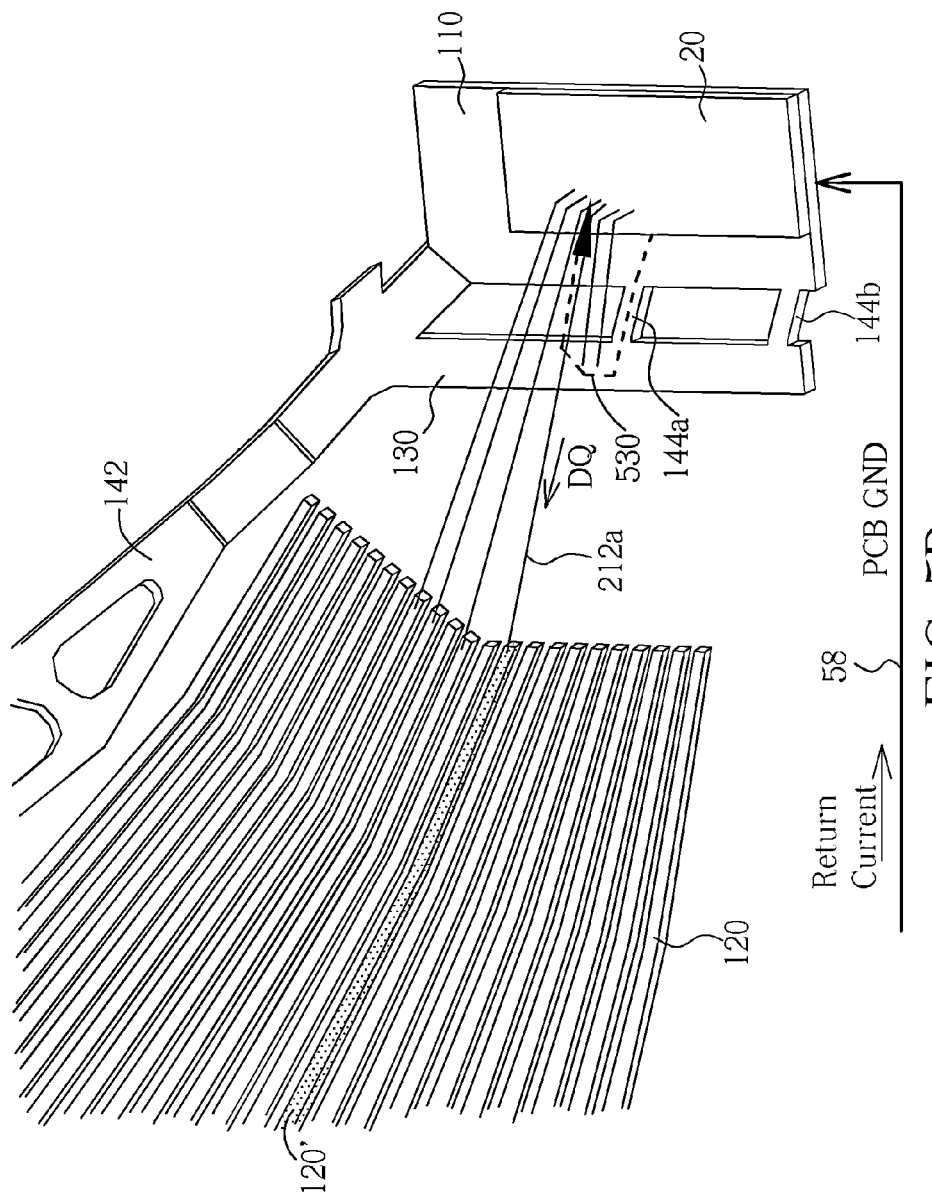
FIG. 5B is a schematic, perspective view of a portion of an E-pad LQFP with more than five bridges per side according to the invention.

FIG. 5A is a schematic, perspective view of a portion of a conventional E-pad LQFP with only two bridges per side. FIG. 5B is a schematic, perspective view of a portion of an E-pad LQFP with more than five bridges per side according to the invention. As shown in FIG. 5A, a semiconductor die 20 such as a memory controller is mounted to the die pad 110 having four peripheral edges. Leads 120 are disposed along the four peripheral edges of the die pad 110. A downset ground bar 130 is provided between the inner ends of the leads 120 and the die pad 110. There are connecting bars 142 extending outward from four corners of the die pad 110. For example, a data signal such DQ signal is transferred by way of the bond wire 212a and the lead 120', and then transferred to the memory chip package through the memory bus or trace on the PCB. The ground plane or trace 58 on the PCB conveys the high-speed or high-frequency return current back to the memory controller 20. The return current first arrives at the exposed die pad and then returns to the memory controller 20 via the path 520. As shown in FIG. 5A, the return current has to pass through the bridge 144b that is farther from the bond wire 212a that originally sends out the DQ signal.

As shown in FIG. 5B, likewise, a semiconductor die 20 such as a memory controller is mounted to the die pad 110 having four peripheral edges. Leads 120 are disposed along the four peripheral edges of the die pad 110. A downset ground bar 130 is provided between the inner ends of the leads 120 and the die pad 110. There are connecting bars 142 extending outward from four corners of the die pad 110. For example, a data signal such DQ signal is transferred by the bond wire 212a and the lead 120', and then transferred to the memory chip package through the memory bus or trace on the PCB, the high-speed or high-frequency return current flowing back to the memory controller 20 through the ground plane or trace 58 on the PCB. In comparison, the return current first arrives at the exposed die pad and then returns to the memory controller 20 via a shorter path 530 by way of the bridge 144a. It is noteworthy that the high-speed or high-frequency return currents follow the return path that has the smallest inductance, that is, the path with the smallest wire loop. By providing a bridge 144a that is in proximity to the bond wire 212a that originally sends out the DQ signal, a smaller wire loop is formed to shorten the return path of high-speed signals. This is why the number of the bridges 144 on each peripheral edge of the die pad 110 is critical for the reduction of the insertion loss. The longer return path 520 in FIG. 5A results in more high-frequency components filtered out and this will slow the edge rate.

As previously mentioned, the E-pad LQFP package is a cost-effective package for DRAM controller. The E-pad LQFP package, when used in combination with a 2-layer PCB, would significantly reduces the system cost. However, the channel of the leadframe package on the 2-layer PCB suffers from a large insertion loss during high-speed operations. Hitherto, no prior art has addressed this issue and the solution to solve the insertion loss of the leadframe package for high-frequency applications has not been proposed. According to the embodiments of the invention, by increasing the number of the bridges on each peripheral edge of the die pad, or reducing the gap length between two adjacent bridges, the return path can be shortened and the insertion loss of the leadframe package operated at high-frequency range can be improved. In one aspect of this invention, the width of each of the bridge can be widened to further reduce the ground inductance.

Figure 6A:
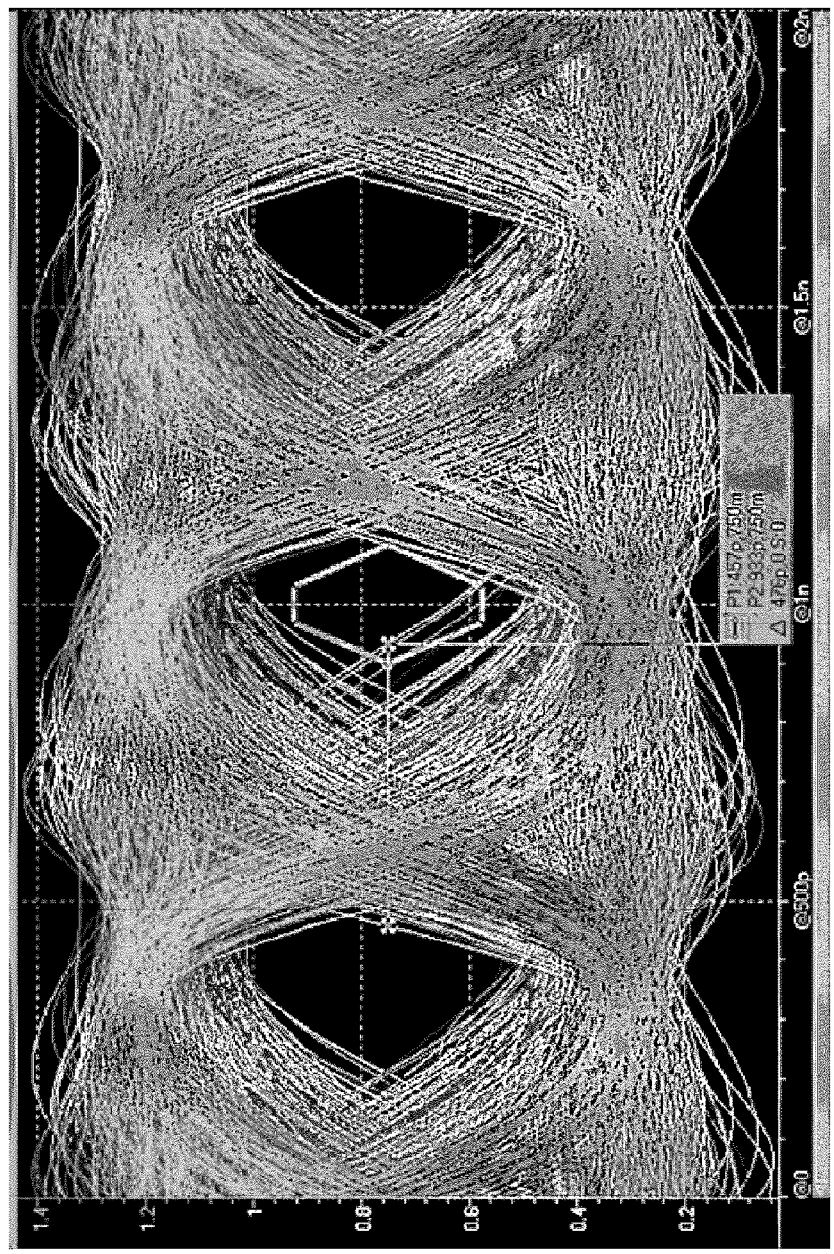
FIG. 6A is an eye diagram plotting signal integrity in the DDR3 data rate of 1.6 Gbps using a conventional E-pad LQFP package with two bridges per side as a test sample.
Figure 6B:
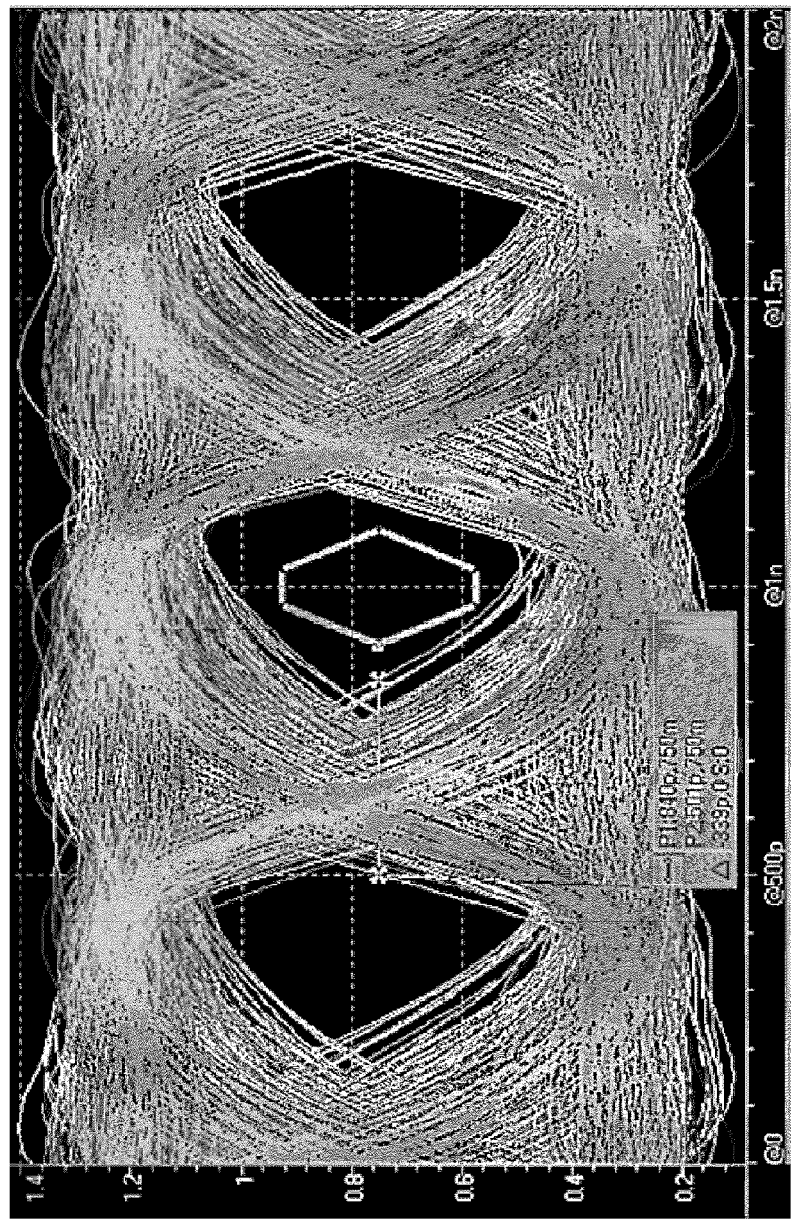
FIG. 6B is an eye diagram plotting signal integrity in the DDR3 data rate of 1.6 Gbps using an E-pad LQFP package with six bridges per side as a test sample.

The improvement in the channel performance is also shown in FIGS. 6A and 6B, wherein FIG. 6A is an eye diagram plotting signal integrity in the DDR3 data rate of 1.6 Gbps using a conventional E-pad LQFP package with two bridges per side as a test sample, and FIG. 6B is an eye diagram plotting signal integrity in the DDR3 data rate of 1.6 Gbps using the invention E-pad LQFP package with six bridges per side as a test sample. As shown in FIGS. 6A and 6B, a hexagon in the graphs is generally defined as an "eye mask" which evaluates if the eye conforms to the system (setup and hold) timing and noise margins. Generally, the eye diagram features the performance of the transmitted signal. An eye diagram overlays the periodic time-domain waveforms appearing when binary bits are applied to an input signal transferred through the transmission line. In the eye diagram, if an eye opens large enough (that is, the eye doesn't cross the mask), it means the test system is good in signal integrity with better timing and noise margins. The signal integrity in FIG. 6B is better than FIG. 6A.

Figure 7A:
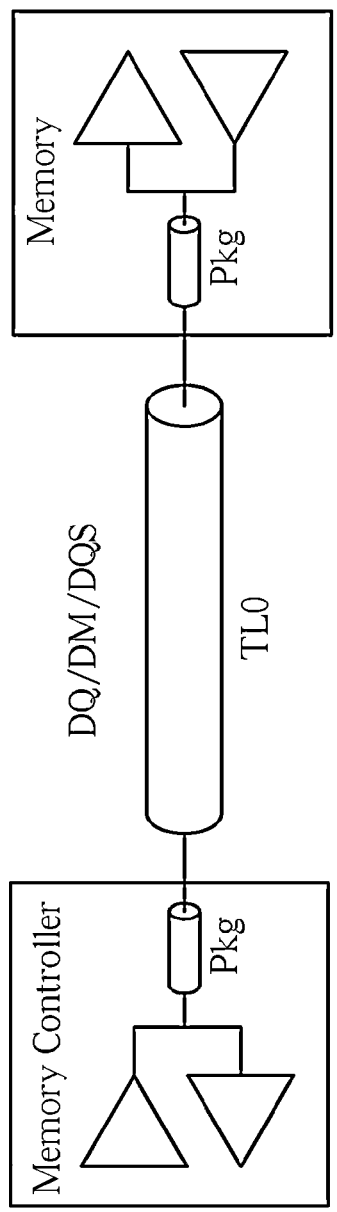
FIGS. 7A-7E are exemplary DDR3 routing topology diagrams.
Figure 7B:
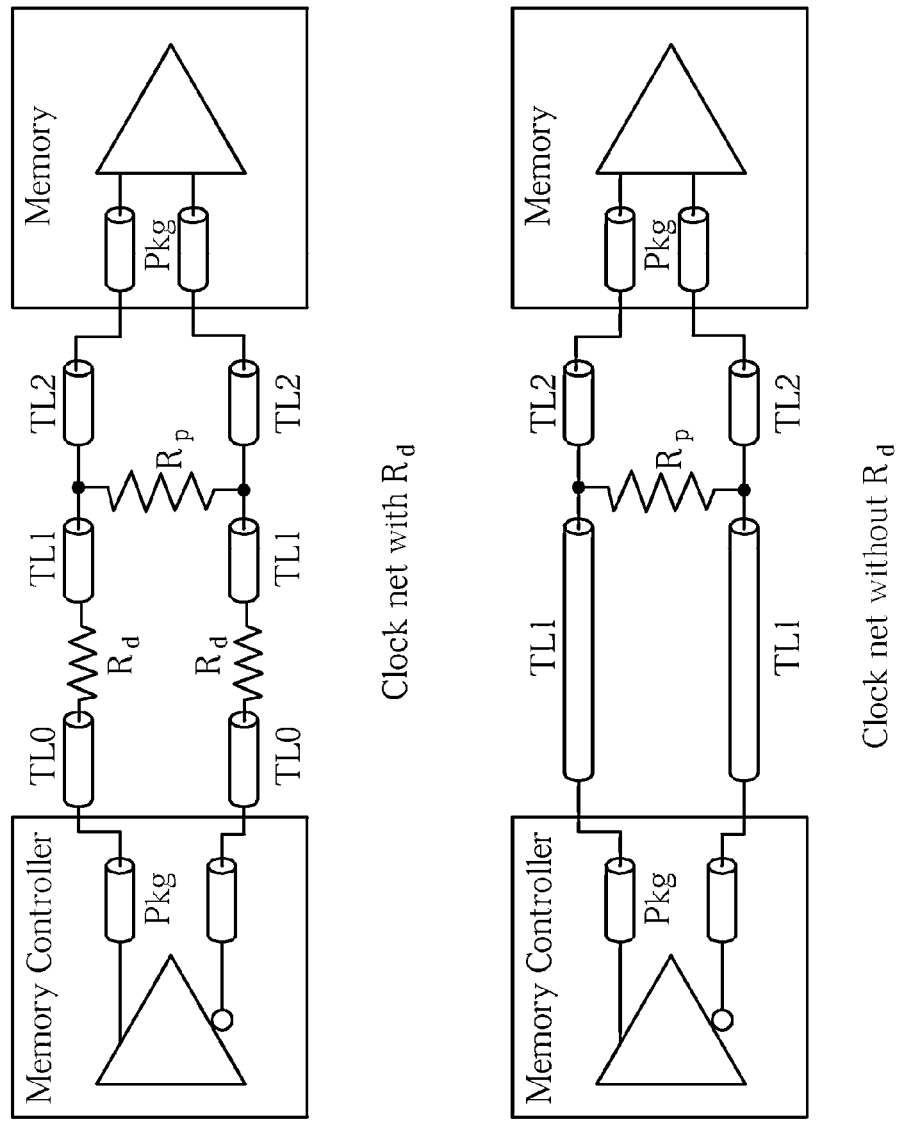
Figure 7C:
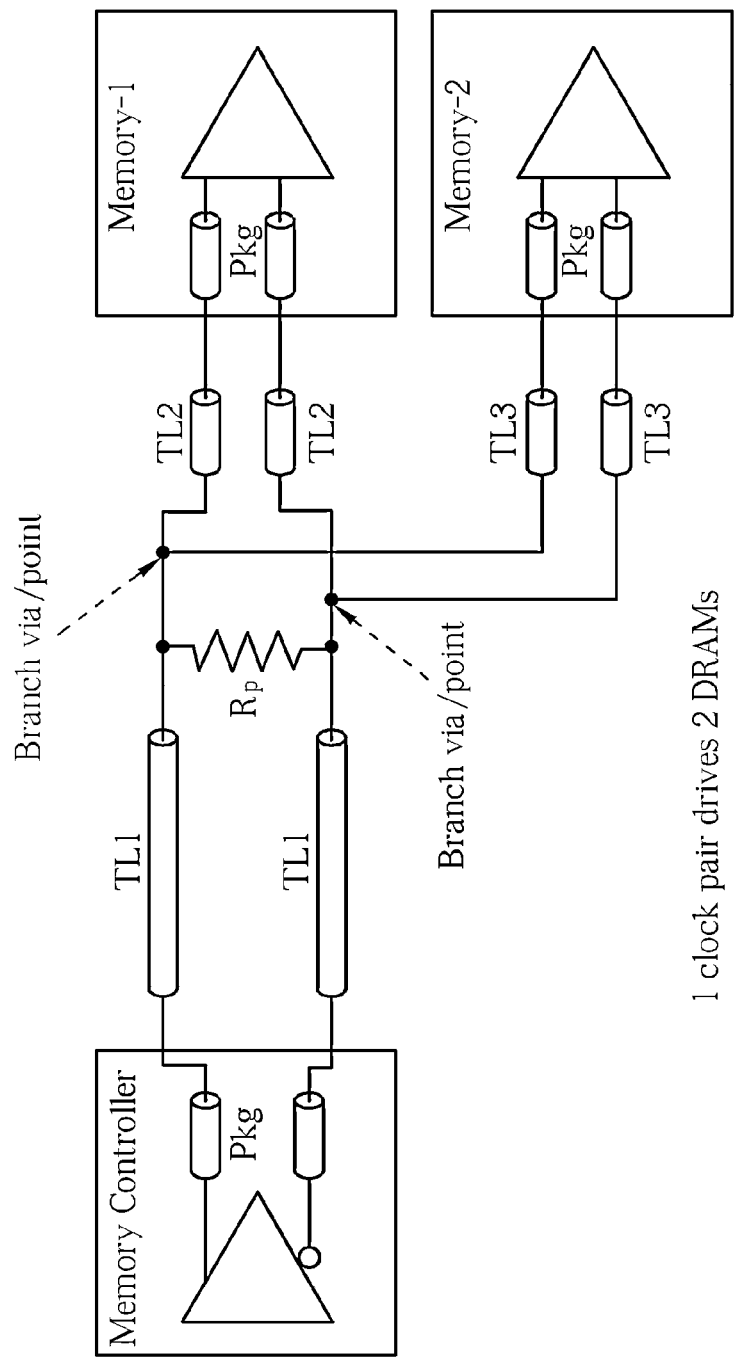
Figure 7D:
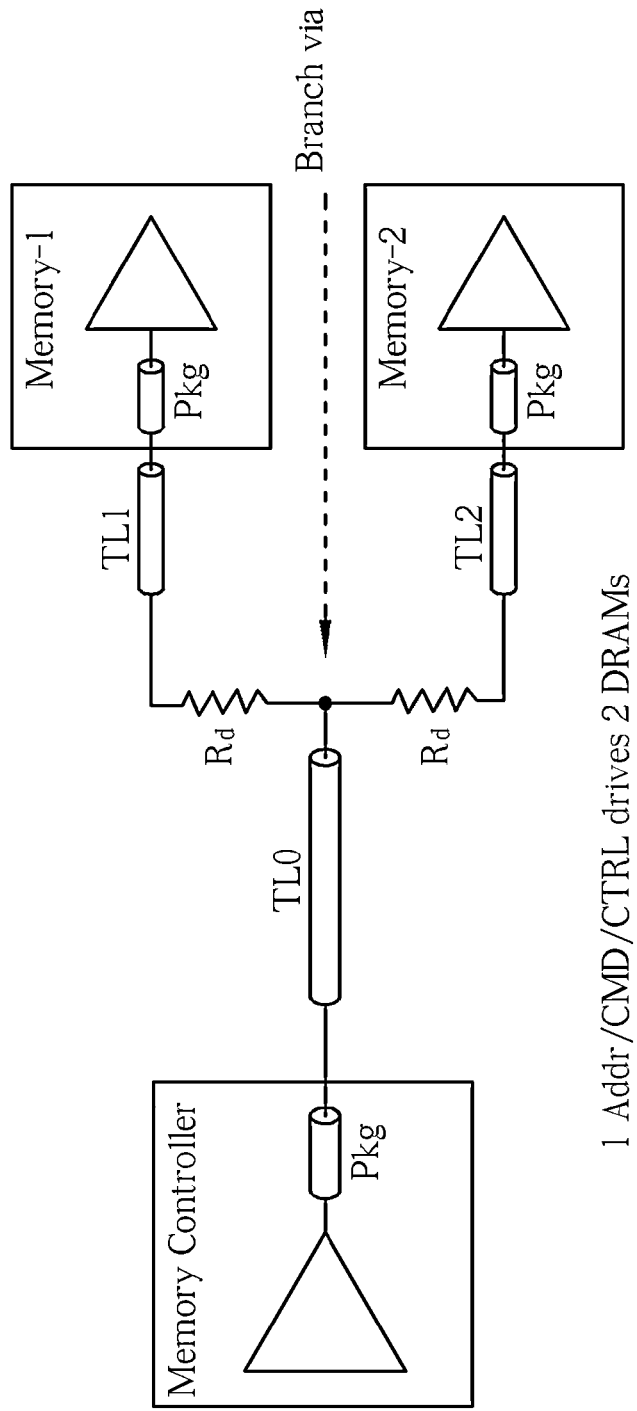
Figure 7E:
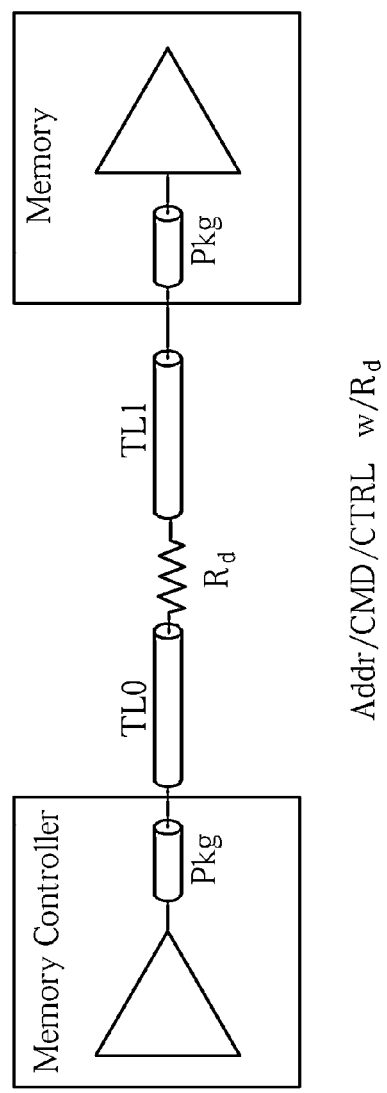

FIGS. 7A-7E are schematic diagrams demonstrating exemplary routing topologies of memory interface in the PCB. TLx (x=0-3) stands for the interconnecting trace in the PCB. $R_d$ and $R_p$ stand for series (damping) resistor and parallel resistor, respectively. Pkg stands for the interconnect inside the memory controller package and the (DRAM) memory package. As shown in FIG. 7A, the memory data group routing may include all the DQ, DQS, and DM signals. FIG. 7B illustrates the layouts for the memory clock signals. The $R_d$ is optional that may range between 0-100Ω if the different controller driver strength is assigned. The $R_p$ is used to terminate the reflective signal due to the impedance discontinuity. FIG. 7C illustrates the layout for the single clock pair connected to dual SDRAMs. Only one termination ($R_p$) is required near the branch via/point. FIG. 7D illustrates the layout of command and control signals in a dual SDRAMs interface. FIG. 7E illustrates the layout of command and control signals connected to a single SDRAM interface with $R_d$. The $R_d$ may range between 0-200Ω if the different controller driver strength is assigned.

Figure 8A:
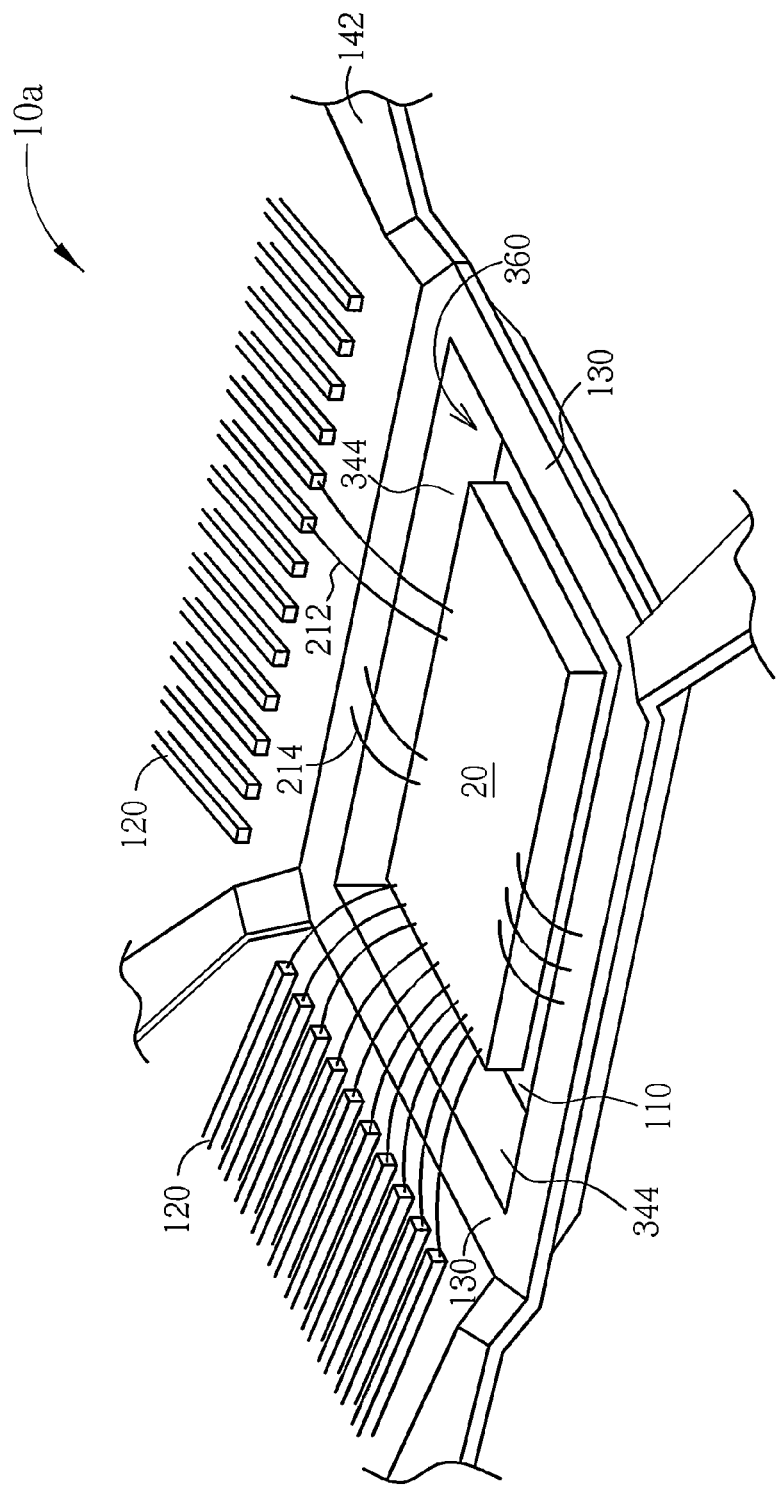
FIG. 8A is a schematic, perspective view of a portion of an E-pad LQFP according to still another embodiment of the invention.
Figure 8B:
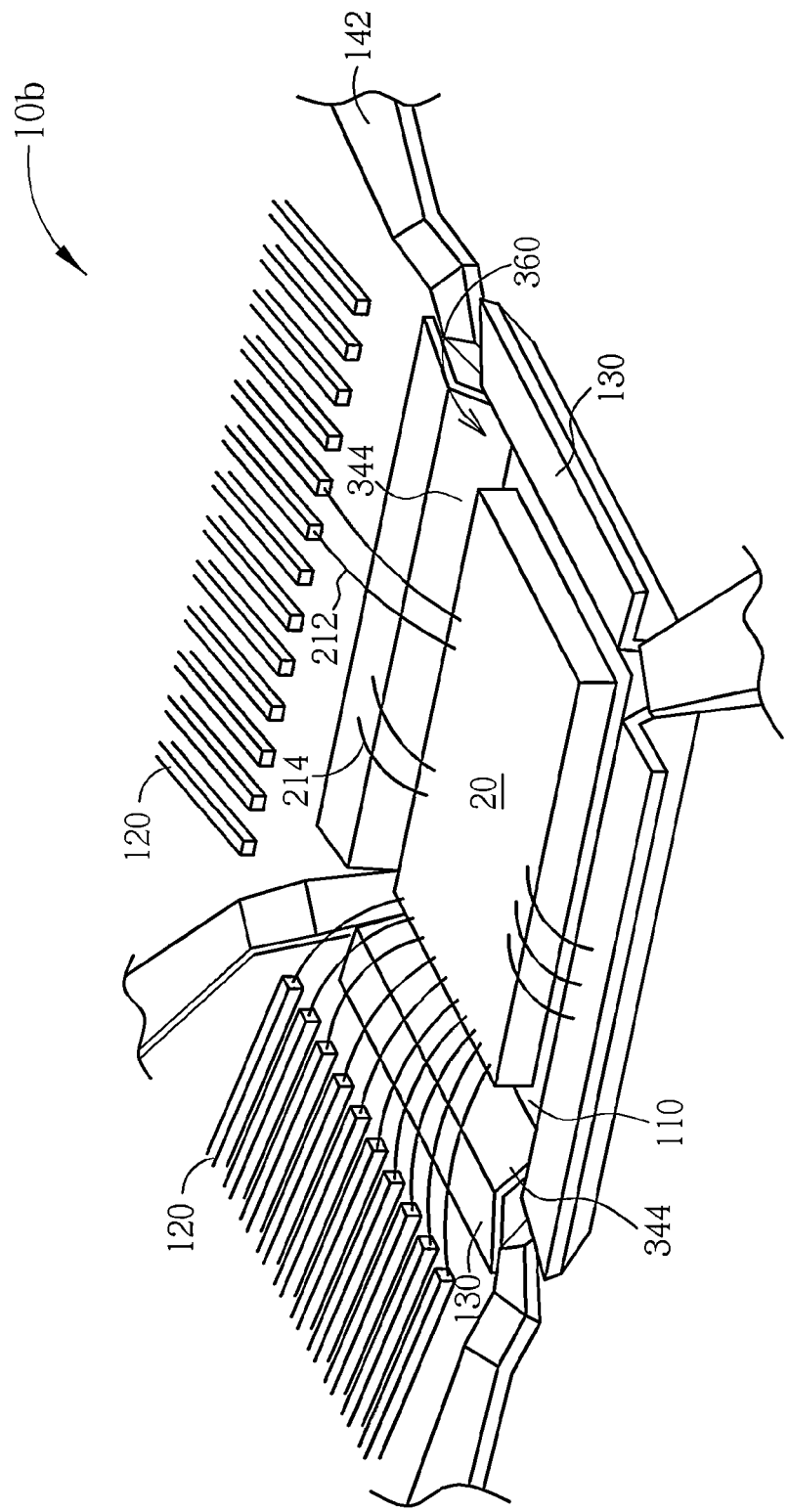
FIG. 8B is a schematic, perspective view of a portion of an E-pad LQFP according to yet another embodiment of the invention.

FIG. 8A is a schematic, perspective view of a portion of an E-pad LQFP according to still another embodiment of the invention, wherein like numeral numbers designate like elements, regions or layers. As shown in FIG. 8A, the semiconductor package 10a comprises a semiconductor die 20 mounted onto the die pad 110 having four peripheral edges, a plurality of leads 120 in a first horizontal plane disposed along the four peripheral edges of the die pad 110, a ground ring comprising four ground bars 130 downset from the first horizontal plane to a second horizontal plane, four connecting bars 142 extending outward from four corners of the die pad 110. The ground bars 130 are electrically connected with the die pad 110 by respective sidewalls 344. Each of the four ground bars 130 is disposed along each of four peripheral edges of the die pad 110 and is connected to two adjacent connecting bars 142. The ground bar 130 and the sidewall 344 may not be connected to the connecting bar 142, as shown in FIG. 8B. For the sake of clarity, the molding compound encapsulating the semiconductor die 20, the die pad 110, the ground bars 130, and the inner ends 120a of the leads 120 are not shown.

The semiconductor die 20 may include, but not limited to, a memory controller chip such as a DDR2, DDR3 or DDR4 SDRAM controller. A plurality of first bonding wires 212 are provided to electrically connect the semiconductor die 20 to the leads 120. A plurality of second bonding wires 214 are provided to electrically connect the semiconductor die 20 to the ground bars 130. According to this embodiment, the bridges and gaps between bridges are replaced with sidewalls 344, and therefore no gap is formed between the ground bar 130 and the die pad 110. The ground ring comprising the four ground bars 130, the sidewalls 344 and the die pad 110, which are configured similar to a rectangular cookie baking tray, are monolithic and are made of the same conductive material. As shown in FIG. 8A, the sidewalls 344 and the die pad 110 define a recessed cavity 360 for accommodating the semiconductor die 20.

FIG. 8B is a schematic, perspective view of a portion of an E-pad LQFP according to yet another embodiment of the invention, wherein like numeral numbers designate like elements, regions or layers. As shown in FIG. 8B, the difference between the E-pad LQFP 10a in FIG. 8A and the E-pad LQFP 10b in FIG. 8B is that the connecting bars 142 are disconnected from the ground bars 130 and the sidewalls 344.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor package, comprising:
   a die pad;
   a semiconductor die mounted on the die pad;
   a plurality of leads disposed along peripheral edges of the die pad;
   a ground bar between the leads and the die pad;
   a plurality of bridges connecting the ground bar with the die pad, wherein a gap between two adjacent said bridges has a length that is equal to or less than 3 mm;
   a plurality of first bond wires extending between the semiconductor die and the leads;
   a plurality of second bond wires extending between the semiconductor die and the ground bar; and
   a molding compound at least partially encapsulating the die pad, inner ends of the leads such that bottom surface of the die pad is exposed within the molding compound.

2. The semiconductor package according to claim 1, wherein number of the bridges on each of the peripheral edges of the die pad is equal to or greater than four.

3. The semiconductor package according to claim 1, wherein width of each of the bridges is equal to or greater than 0.1 mm.

4. The semiconductor package according to claim 1, wherein the semiconductor die comprises memory controller.

5. The semiconductor package according to claim 4, wherein the memory controller comprises DDR2, DDR3 or DDR4 SDRAM controller.

6. A semiconductor package, comprising:
   a die pad;
   a semiconductor die mounted on the die pad;
   a plurality of leads disposed along peripheral edges of the die pad;
   at least two adjacent connecting bars extending outward from respective two adjacent corners of the die pad;
   at least one ground bar between the at least two adjacent connecting bars;
   a sidewall connecting the ground bar with the die pad between the at least two adjacent connecting bars, wherein the sidewall has a length that is substantially equal to a length of the ground bar;
   a plurality of first bond wires extending between the semiconductor die and the leads;
   a plurality of second bond wires extending between the semiconductor die and the ground bar; and
   a molding compound at least partially encapsulating the die pad, inner ends of the leads such that bottom surface of the die pad is exposed within the molding compound.

7. The semiconductor package according to claim 6, wherein the semiconductor die comprises memory controller.

8. The semiconductor package according to claim 7, wherein the memory controller comprises DDR2, DDR3 or DDR4 SDRAM controller.

9. The semiconductor package according to claim 6, wherein the ground bar, the sidewall and the die pad are configured similar to a rectangular cookie baking tray.

10. The semiconductor package according to claim 6, wherein the ground bar, the sidewall and the die pad are monolithic and are made of the same conductive material.

11. The semiconductor package according to claim 6, wherein the sidewall and the die pad define a recessed cavity for accommodating the semiconductor die.

* * * * *